(12) United States Patent
Kobayashi

(10) Patent No.: US 6,301,127 B1
(45) Date of Patent: Oct. 9, 2001

(54) CIRCUIT BLOCK FOR POWER SUPPLY

(75) Inventor: Toshihiko Kobayashi, Iruma (JP)

(73) Assignee: Tamura Corporation, Tokyo (JP)

( * ) Notice: Subject to any disclaimer, the term of this patent is extended or adjusted under 35 U.S.C. 154(b) by 0 days.

(21) Appl. No.: 09/639,528

(22) Filed: Aug. 16, 2000

(30) Foreign Application Priority Data

Sep. 29, 1999 (JP) ................................................. 11-275558

(51) Int. Cl.$^7$ .................................................... H05K 7/00
(52) U.S. Cl. ......................... 361/836; 361/752; 361/753; 361/774; 336/90; 336/192
(58) Field of Search .................. 361/752, 753, 361/299.2, 299.3–299.5, 298.4, 835, 836; 336/90, 98, 192, 198

(56) References Cited

U.S. PATENT DOCUMENTS

| | | | |
|---|---|---|---|
| 3,699,394 | * 10/1972 | Schuler | 317/100 |
| 4,939,494 | * 7/1990 | Masuda et al. | 336/192 |
| 5,034,854 | * 7/1991 | Matsumura et al. | 361/396 |
| 5,157,368 | * 10/1992 | Okano et al. | 336/90 |
| 5,182,700 | * 1/1993 | Weimer | 361/400 |
| 5,815,378 | * 9/1998 | Nagai | 361/836 |
| 5,996,214 | * 12/1999 | Bell | 29/605 |
| 6,144,278 | * 11/2000 | Nishida et al. | 336/92 |
| 6,157,284 | * 12/2000 | Kanazawa | 336/198 |

FOREIGN PATENT DOCUMENTS

| | | |
|---|---|---|
| 11-28013 | 5/1989 | (JP) . |
| 09129451 A | 5/1997 | (JP) . |
| 2000050617 A | 2/2000 | (JP) . |
| 2000060125 A | 2/2000 | (JP) . |
| P2000-228312A | 8/2000 | (JP) . |

* cited by examiner

Primary Examiner—Jeffrey Gaffin
Assistant Examiner—Tuan Dinh
(74) Attorney, Agent, or Firm—Dennis G. LaPointe; Mason & Associates, P.A.

(57) ABSTRACT

In the case where a power supply circuit assembly having a small transformer and various electronic components mounted on a mounting substrate is housed in an insulating case, and the case is filled with a resin, the occurrence of cracks at soldering parts situated around the roots of pin terminals projecting from a lower surface of the mounting substrate is avoided. In a circuit block configured in such a manner that an assembly (1) comprising a mounting substrate (2) constituting the power supply circuit is housed in a case (13), and the case (13) is filled with a resin (14), primary-side pin terminals (11) and secondary-side pin terminals (12) are formed to have an L-shape, and their linear portions pass through a coil bobbin (6). It is also configured in such a manner that the mounting part of the coil bobbin (6) makes contact with the upper surface of the mounting substrate (2) and is mounted on the mounting substrate (2), and an opening (15) is provided at roughly the center of the mounting substrate (2).

3 Claims, 4 Drawing Sheets

PRIOR ART

PRIOR ART

CIRCUIT BLOCK FOR POWER SUPPLY

BACKGROUND OF THE INVENTION

1. Field of the Invention

The present invention relates to a circuit block for power supply, such as a switching power supply or AC/DC converter, which is incorporated into electronic equipment, such as TV or VTR.

2. Description of the Prior Art

There is a demand of the times that the so-called household electrical appliances, such as TV, VTR, or mini-component stereo system, have more compact size and higher performance. Therefore, it is required to increase the packaging density of components of household electrical appliances.

However, as shown in FIG. 4, conventionally, when configuring a circuit block for a power supply comprising a small transformer, which is used as a switching power supply or the like, the circuit block is configured in such a manner that a transformer 21 is mounted on a mounting substrate 20 for power supply via its primary-side (i.e. its input side) pin terminals 22 and secondary-side (i.e. its output side) pin terminals 23, components, such as a control IC 24, a FET 25, and other appropriate electronic chip components 26, 27, which constitute a primary-side circuit are mounted on the mounting substrate 20, and secondary-side components, such as a capacitor 28, are mounted on the side of the secondary-side pin terminals 23, the opposite side of the primary side where the primary-side components are mounted.

FIG. 5 shows an example of a feedback circuit from the secondary-side-to the primary-side. The circuit is configured in such a manner that a photocoupler 29 is mounted on the substrate 20 via its terminals, the primary-side circuit components, such as a transistor 30, are mounted on one side of the photocoupler, and the secondary-side circuit components, such as a transistor 31 and diode 32, are mounted on the opposite side of the photocoupler.

In such a case, a safety standard for power supply circuit, such as a switching power supply, requires that it be ensured that there is a prescribed distance between the primary-side pin terminals and the secondary-side pin terminals. The distance is prescribed for their creeping and spatial distances. The spatial distance of these distances can be reduced by interposing an insulating plate (not shown) between the primary-side and secondary-side pin terminals to the order of 0.8 mm depending on the thickness of the insulating plate.

However, with regard to the creeping distance, in the conventional circuit block for power supply shown in FIG. 4, the distance between the primary-side pin terminals 22 for input and the secondary-side pin terminals 23 for output is required to be 10 mm in terms of insulation, and in addition, the input-side electronic components, such as control IC 24, are not able to be mounted within 10 mm from the output-side pin terminals 23, so that the miniaturization and high density mounting have been constrained. The same thing can be said for the feedback circuit incorporated in the power supply circuit, shown in FIG. 5, and the distance between the terminals is required to be 10 mm.

In order to overcome the above-described drawback, the present applicant has already filed the Japanese Patent Application No. 11-028013 on Feb. 5, 1999.

FIG. 6 is a longitudinal section showing diagrammatically a circuit block for power supply produced based on the patent application. FIG. 7 is an enlarged view of the portion where a terminal 120 is inserted into a terminal insertion hole (not shown) of the mounting substrate 20.

This circuit block for power supply is configured as follows. A small transformer 300 is configured by winding a coil 80 around a coil bobbin 60, and incorporating a core 90 into the coil bobbin 60. Flanges 70 are provided at both ends of the coil bobbin 60, and a primary-side pin terminals 110 and secondary-side pin terminals 120 are embedded into thick portions 100 provided at the lower portions of the flanges, respectively. Each of the pin terminals 110, 120 is inserted into the terminal insertion hole (not shown) of the mounting substrate 20. On the mounting substrate 20, a control IC 40 and various electronic components 50 are mounted. An assembly configured by these elements is housed in a case 130 having an open bottom and formed from a molded insulation.

In the circuit block for power supply configured as described above, the coil 80 of the small transformer 300 consists of a primary coil and secondary coil, and it is necessary to ensure the insulation in the region of the coils, and between the primary-side pin terminals 110 and secondary-side pin terminals 120 of the small transformer 300, etc.

For this purpose, the case 130 is filled with an insulating resin 140, such as an epoxy resin, by a vacuum filling.

With the vacuum filling, the space between the primary-side pin terminals 110 and secondary-side pin terminals 120 is filled with the resin 140 without any bubble remaining, and the resin 140 enters into between the electronic components and between wires of the coil 80, so that a sufficient insulating effect can be provided to insulate the components with respect to each other.

According to the Japanese Patent Application No. 11-028013, in which the case 130 is filled with the resin 140 by the vacuum filling, the insulation is enhanced so that advantages, for example, as described below are provided.

a. Since the primary coil and secondary coil can be brought close to each other, the magnetic coupling is enhanced, thereby the characteristics of the small transformer 300 can be expected to be improved.

b. As a result, the size of the portion of the coil 80 of the small transformer 300 can be reduced, so that the miniaturization becomes possible.

c. Since the distance between the primary-side pin terminals 110 and secondary-side pin terminals 120 of the small transformer 300 can be reduced, the miniaturization becomes possible, and since the electronic components can be placed at the space between the terminals, the mounting area can be reduced, so that the miniaturization also becomes possible in this respect.

d. The insulating plate conventionally used is not necessary. Therefore, miniaturization that is better than was previously possible can be attained.

However, in the circuit block for power supply configured as described above, since the volume of the resin 140 filling the case 130 is reduced when the resin is hardened, so that a residual stress is generated in the resin after the resin is hardened, and furthermore in the case where a temperature cyclic test, such as thermal shock test, is performed on the product, the residual stress and stresses due to the thermal expansion and contraction of the resin 140 is applied to the mounting substrate 20, there is a problem of cracks that occur at the soldering parts "a" situated around the roots of the input pin terminals 110 and output pin terminals 120 projecting downwardly from the mounting substrate 20, as shown in FIG. 6 by "a".

In particular, in the circuit block for power supply configured as shown in FIG. 6, the pin terminals 120 is press fitted into the thick portion 100 of the coil bobbin 80. In such a case, as shown in FIG. 7, a cavity "b" is inevitably produced at the internal end of the press fitted pin terminals 120. Although the length of the cavity is on the order of 0.3 mm at the minimum, the pin terminals are further press fitted into the interior by the residual stress and stresses due to the thermal expansion and contraction of the resin 140 applied to the pin terminals 120 themselves. This becomes "a" cause of the occurrence of cracks at the soldering parts a of the mounting substrate 20.

And, an outgoing line 80' from the coil 80 is wrapped around the pin terminals 120 (110). As shown in FIG. 7, in order to handle the outgoing line 80', there is no other choice but to provide a clearance "g" between the lower surface of the thick portion 100 of the coil bobbin 60 and the upper surface of the mounting substrate 20. In such a state, the residual stress and stresses due to the thermal expansion and contraction of-the resin applied to the coil bobbin 60 and the mounting substrate 20 have different values, this also becomes a cause of the occurrence of cracks at the soldering parts "a" of the mounting substrate 20.

SUMMARY OF THE INVENTION

The present invention is proposed in view of the above description, and an object of the present invention is to provide a circuit block for a power supply to prevent the occurrence of crack at the soldering parts of the mounting substrate.

According to the present invention, the above described object is achieved by a circuit block for power supply comprising an assembly having a power supply circuit configured by a small transformer 3 and various electronic components 5 mounted on a mounting substrate 2 so that primary-side pin terminals 11 and secondary-side pin terminals 12 of said small transformer 3 are spaced apart and project from the bottom of said mounting substrate 2, the assembly being housed in a case 13 having an opening 13a, and the case 13 being filled with an insulating resin 14 via said opening 13a by vacuum filling, the circuit block for power supply being configured in such a manner that a thick portion 10 is provided at the lower portion of each of flanges 7 of a coil bobbin 6 of said small transformer 3, and the primary-side pin terminals 11 and secondary-side pin terminals 12 are embedded into each thick portion 10, the pin terminals 11, 12 have an L-shape having a linear portion 11a, 12a and a folded portion 11b, 12b folded in the shape of an L at the end of the linear portion, respectively, the linear portions 11a and 12a pass through longitudinally said thick portions 10, the folded portions 11b and 12b project laterally from the upper surface of the thick portions 10, and outgoing lines of the coil 8 of said small transformer 3 are wrapped around the projecting portions, a mounting part of each of said thick portions 10 to be mounted on the mounting substrate is flat, so that it makes contact with and is mounted on the upper surface of the mounting substrate, and said primary-side and secondary-side pin terminals 11, 12 project from the lower surface of the mounting substrate 2, the outside shape of said case 13 is shaped to conform to the outside shape of said assembly 1 so that the amount of the resin for filling the vicinity of the folded portions 11b, 12b of said pin terminals 11, 12 is minimized, and an opening 15 is provided at roughly the center of said mounting substrate 2 so that the residual stress and stresses due to the thermal expansion and contraction of the resin generated above and below the mounting substrate 2 provided in said case 13 have values that are substantially equal or close to each other.

In addition, the circuit block for power supply is configured in such a manner that the opening 15 of the mounting substrate 2 has slits 15a extending between the primary-side pin terminals 11 and the electronic components 5 mounted on said mounting substrate 2.

In addition, the circuit block for power supply is configured in such a manner that the area of the opening 15 of the mounting substrate 2 is more than about 5 percent of the area of the substrate and falls within a range in which the opening 15 cannot adversely affect the mounting of the small transformer 3 and electronic components 5, etc. on the mounting substrate 2, and the strength of the mounting substrate.

DETAILED DESCRIPTION OF THE PREFERRED EMBODIMENTS

The present invention will be described below with reference to the drawings.

Embodiments

Figure 1:
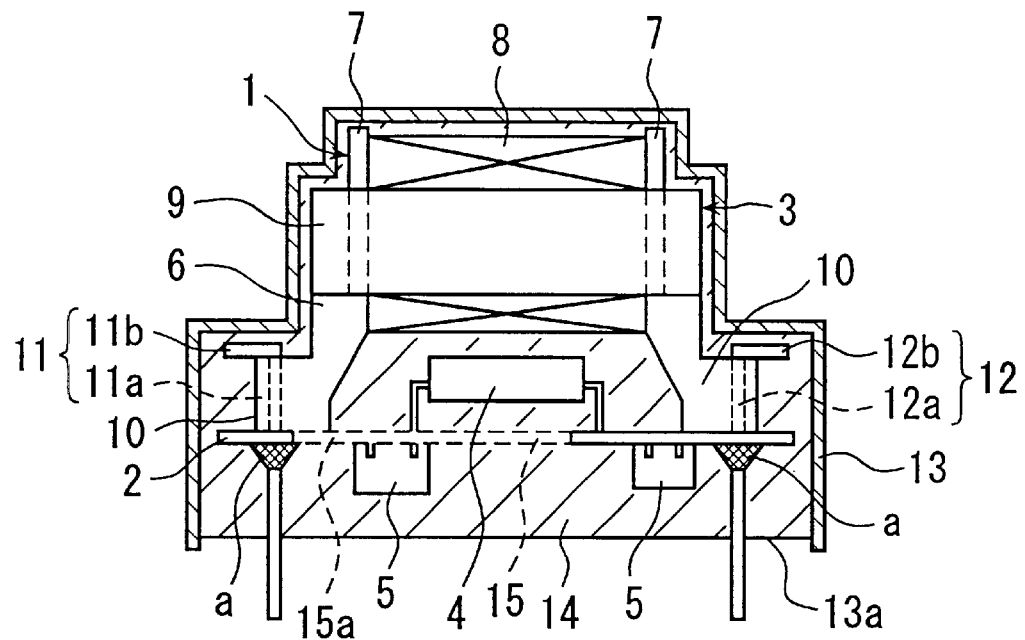
FIG. 1 is a longitudinal section showing diagrammatically a circuit block according to an embodiment of the present invention.
Figure 2:
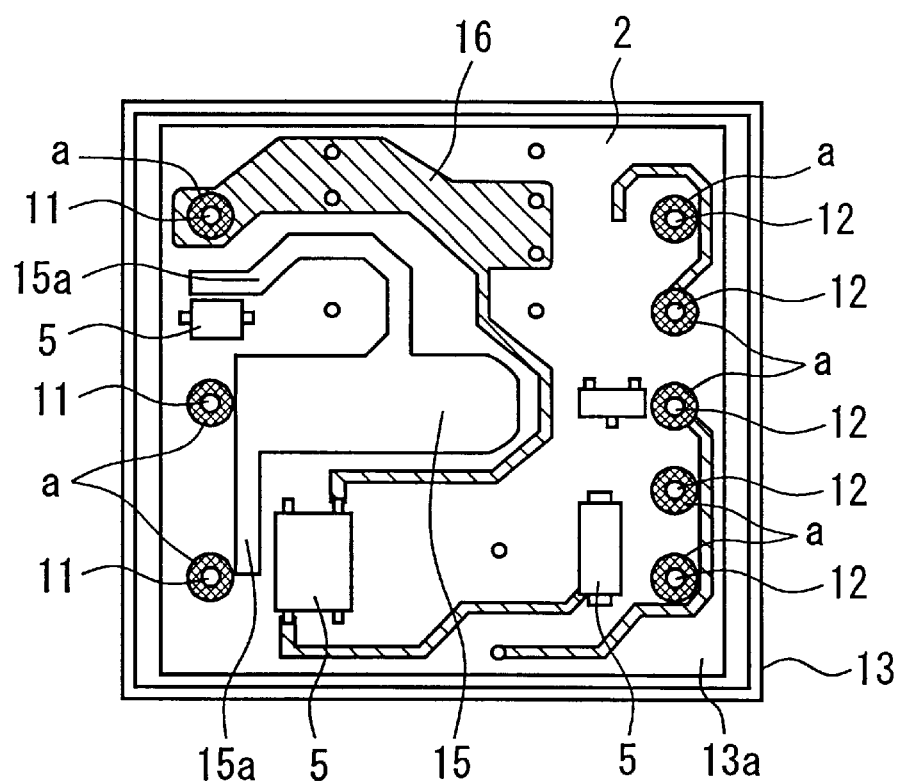
FIG. 2 is a bottom view of the circuit block according to the present invention showing a power supply circuit assembly housed in a case before the case is filled with a resin.
Figure 3:
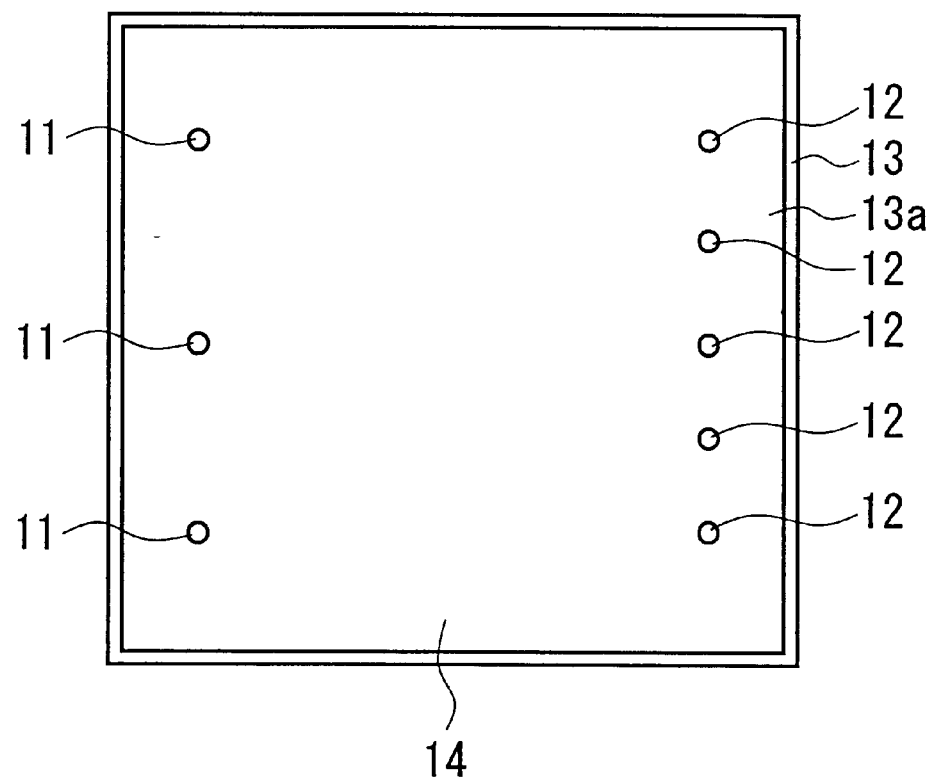
FIG. 3 is a bottom view of the circuit block according to the present invention after the case is filled with the resin.
Figure 4:
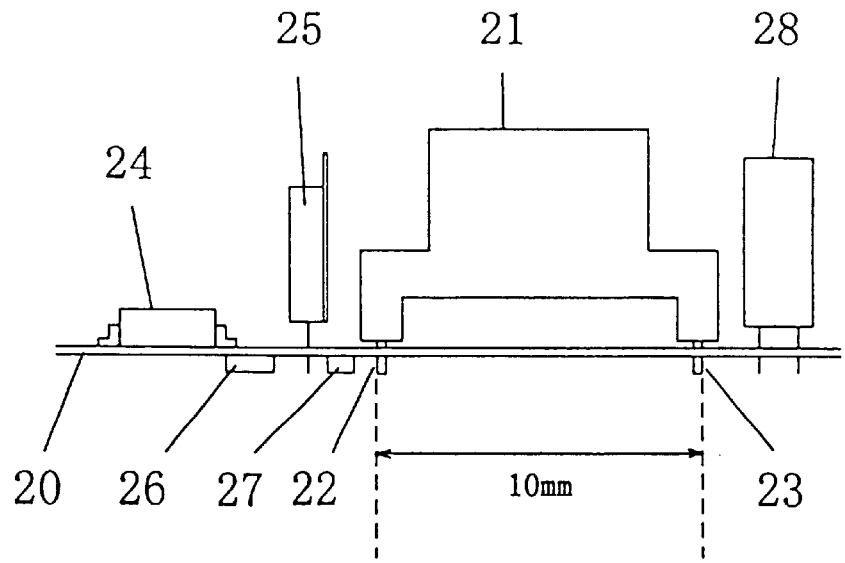
FIG. 4 is a diagram for explaining an example of a conventional circuit block for power supply.
Figure 5:
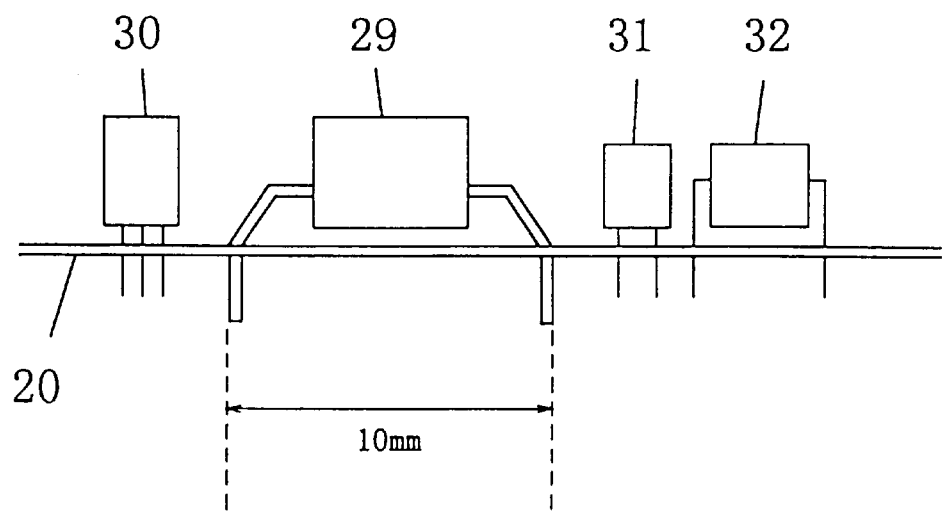
FIG. 5 is a diagram for explaining an example of a feedback circuit used in the conventional circuit block for power supply.

FIG. 1 is a longitudinal section showing diagrammatically a circuit block according to an embodiment of the present invention, FIG. 2 is a bottom view of the circuit block shown in FIG. 1, which shows a power supply circuit assembly comprising a mounting substrate housed in a case before the case is filled with an insulating resin, and FIG. 3 is a bottom view of the circuit block after the case is filled with the insulating resin.

The power supply circuit assembly 1 according to the present invention is configured to be provided with a flat mounting substrate 2, small transformer 3 mounted on the mounting substrate 2, control IC 4 mounted on a space of the upper surface of the mounting substrate 2, and various electronic components 5, such as a transistor, mounted on the lower surface of the mounting substrate 2. The small transformer 3, control IC 4, and electronic components 5, etc. constitute a prescribed power supply circuit, for example, a switching power supply circuit. The power supply circuit may be an AC/DC converter. A well-known circuit may be appropriately adopted as such a circuit. A description of the power supply circuit itself is omitted from the specification, since it is not essential to the present invention.

The small transformer 3 is formed from a molded insulation, and is provided with a coil bobbin 6 having flanges 7 formed on its each end, coil 8 wound around the coil bobbin 6, and a core 9 incorporated into the coil bobbin 6 having the coil 8 wound around.

The lower portion of each flange 7 of the coil bobbin 6 is formed to be thicker to constitute a thick portion 10. Primary-side pin terminals 11 and secondary-side pin terminals 12 are embedded into the thick portion 10.

Each of the pin terminals 11, 12 has an L-shape as a whole, and consists of a linear portion 11a, 12a, and a folded portion 11b, 12b folded outwardly at the upper end of the linear portion 11a, 12a, respectively.

The folded portions 11b and 12b project outwardly from the upper portion of the thick portions 10, and outgoing lines of the coil 8 (not shown) are wrapped around the folded portions. The linear portions 11a and 12a pass through longitudinally the thick portions 10, and the portion at the lower end of the linear portion projects from the lower surface of the mounting substrate 2.

The lower surfaces of the thick portions 10 are flat, and the thick portions are mounted at the predetermined location on the upper surface of the mounting substrate 2. Since the lower surfaces of the thick portions 10 are flat, there is no gap between these lower surfaces and the upper surface of the mounting substrate 2.

The above described power supply circuit assembly 1 is formed from a molded insulating resin, and is housed in the case 13 having an open bottom. Reference numeral 13 a in FIGS. 1 and 2 denotes the opening of the case 13. As shown in FIGS. 1 and 3, the case 13 is filled with the insulating resin 14, such as an epoxy resin, by vacuum filling.

The outside shapes of the side and top surfaces of the case 13 are shaped to substantially conform to the outside shape of the power supply circuit assembly 1. The gap between the outer surface of the power supply circuit assembly 1 and the inner surface of the case 13 is small.

According to the present invention, the clearance between the folded portions 11b and 12b of the pin terminals 11 and 12, around which the outgoing lines of the coil 8 wrapped, and the inner surface of the case 13 is kept small, thereby the amount of the resin is minimized. In this way, a residual stress and stresses due to the thermal expansion and contraction of the resin applied to the area around the folded portions 11b and 12b of the pin terminals 11 and 12 are minimized to eliminate a factor responsible for the occurrence of cracks.

In the conventional example shown in FIGS. 6 and 7, the filling resin 140 is divided into two regions above and below the mounting substrate 20 by the mounting substrate 20 in the case 130. Therefore, the values of the residual stress and stresses due to the thermal expansion and contraction of the resin 140 applied to the regions above and below the mounting substrate 20 are different, which is a factor responsible for the occurrence of cracks at the soldering parts "a" on the lower surface of the mounting substrate 20.

According to the present invention, as shown in FIGS. 1 and 2, an opening 15 is provided at roughly the center of the mounting substrate 2 so that the residual stress and stresses due to the thermal expansion and contraction of the resin 14 can be allowed to be distributed efficiently over the regions above and below the mounting substrate 2, which results in the elimination of the factor responsible for the occurrence of cracks at the soldering parts "a" of the mounting substrate 2.

As shown in FIG. 2, slits 15a are connected to the opening 15 to enhance the insulation, for example, between the primary-side pin terminals 11 and the electronic components 5 mounted in the vicinity of them. In addition, as shown in FIG. 2 by oblique lines, a wiring pattern 16 is provided on the mounting substrate 2 to interconnect the pin terminals 11, 12, and each of the electronic components 5, etc. to form a prescribed power supply circuit. The wiring pattern 16 and mounting locations of each of the electronic components 5 are strictly illustrative. Suitable wiring pattern and mounting locations of each of the electronic components may be appropriately adopted according to the type and size, etc. of the power supply circuit.

It is preferable that the area of the opening 15 of the mounting substrate 2 is more than about 5 percent of the area of the substrate, because the residual stress and stresses due to the thermal expansion and contraction of the resin 14 generated above and below the mounting substrate 2 have values that are substantially equal or can be brought close to each other. And, the opening area of the opening 15 is more than about 5 percent of the area of the substrate, and the value of the upper limit of the opening area falls within a range in which the opening 15 cannot adversely affect the mounting of the small transformer 3 and electronic components 5, etc. on the mounting substrate 2, and the strength of the mounting substrate.

Figure 6:
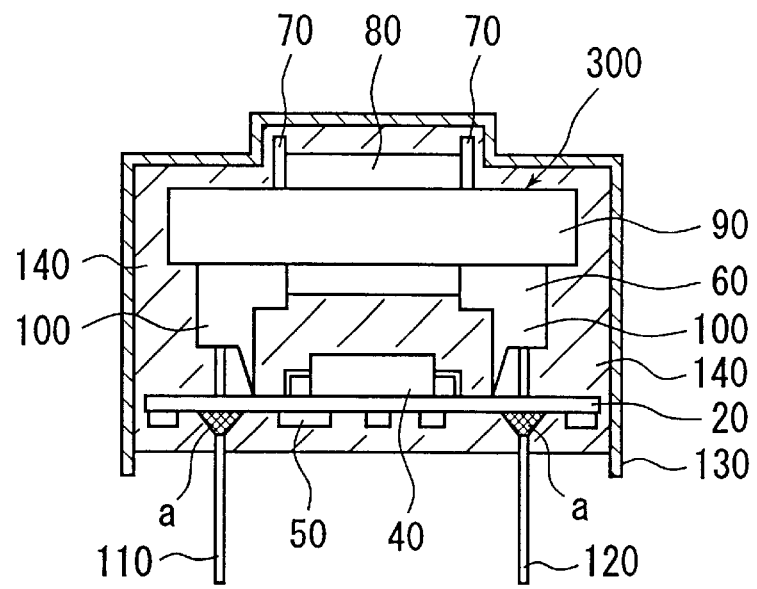
FIG. 6 is a longitudinal section showing diagrammatically a conventional circuit block for power supply according to the prior art.
Figure 7:
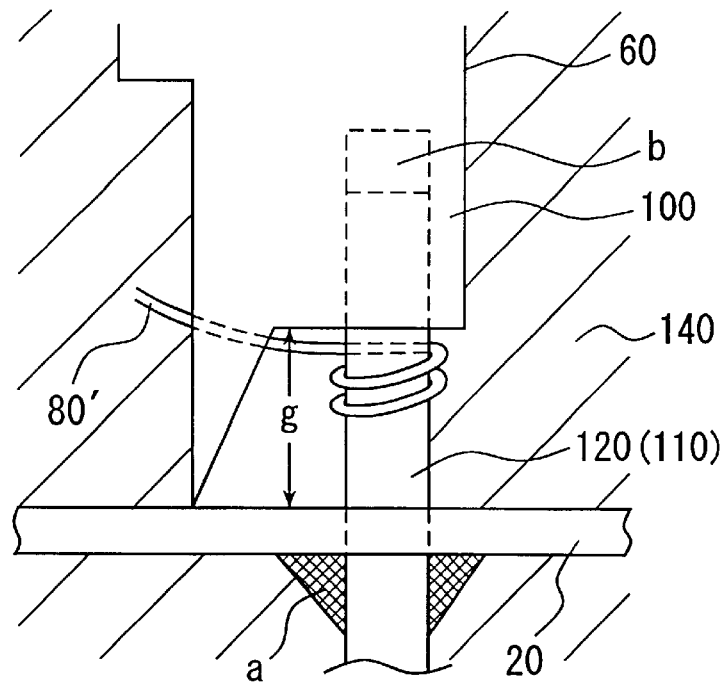
FIG. 7 is a partially enlarged view for explaining the conventional circuit block for power supply.

Results of a temperature cyclic test, such as thermal shock test, for the circuit block for power supply according to the present invention configured as described above and the conventional circuit block shown in FIG. 6 is shown in table 1 below.

TABLE 1

| Test time | 150 H | 300 H | 500 H | 750 H | 1000 H |
|---|---|---|---|---|---|
| Conventional | Crack not occur | Crack occur, disconnection occur at portion (a) | | | |
| Present invention | Crack not occur | Crack not occur | Crack not occur | Crack not occur | Crack not occur |

Condition of thermal shock test (1 cycle): −30° C., 30 minutes/+85° C., 30 minutes As described above, the linear portions 11a and 12a of the primary-side and secondary-side pin terminals 11 and 12, respectively, pass through the coil bobbin 6. And, according to the present invention, the circuit block, which is configured in such a manner that the mounting part of the coil bobbin 6 makes contact with the upper surface of the mounting substrate 2 and is mounted on the mounting substrate 2, the opening 15 is provided at roughly the center of the mounting substrate 2, and the case 13 is filled with the resin 14, has the effect of preventing the occurrence of the cracks at the soldering parts a situated around the roots of the pin terminals 11 and 12 projecting from the lower surface of the mounting substrate 2.

What is claimed is:

1. A circuit block for power supply comprising:
   an assembly (1) having a power supply circuit configured by a small transformer (3) and electronic components (5) mounted on a mounting substrate (2) so that primary-side pin terminals (11) and secondary-side pin terminals (12) of said small transformer (3) are spaced apart and project from the bottom of said mounting substrate (2), the assembly (1) being housed in a case (13) having an opening (13a), and the case (13) being filled with an insulating resin (14) via said opening (13a) by vacuum filling, wherein a thick portion (10) is provided at a lower portion of each of flanges (7) of a coil bobbin (6) of said small transformer (3), and the primary-side pin terminals (11) and secondary-side pin terminals (12) are embedded into each thick portion 10, wherein the pin terminals (11), (12) have an L-shape having a linear portion (11a), (12a) and a folded portion (11b), (12b) folded in the shape of an L at the end of the linear portions (11a), (12a), respectively, wherein the linear portions (11a) and (12a) pass through longitudinally said thick portions (10), the folded portions (11b) and (12b) project laterally from an upper surface of the thick portions (10), and outgoing lines of the coil (8) of said small transformer (3) are wrapped around the folded portions (11b), 12b), wherein a mounting part of each of said thick portions (10) to be mounted on the mounting substrate (2) is flat, so that it makes contact with and is mounted on an upper surface of the mounting substrate (2), and said primary-side and secondary-side pin terminals (11), (12) project from a lower surface of the mounting substrate (2), wherein an outside shape of said case (13) is shaped to conform to an outside shape of said assembly (1) so that an amount of the resin for filling a vicinity of the folded portions (11b), (12b) of said pin terminals (11), (12) is minimized, and wherein an opening (15) is provided at an approximate center of said mounting substrate (2) so that a residual stress and stresses due to a thermal expansion and contraction of the resin generated above and below the mounting substrate (2) provided in said case (13) have values that are substantially proximate each other.

2. The circuit block for power supply according to claim 1, wherein the opening (15) of the mounting substrate (2) has slits (15a) extending between the primary-side pin terminals (11) and the electronic components (5) mounted on said mounting substrate (2).

3. The circuit block for power supply according to claim 1, wherein an area of the opening (15) of the mounting substrate (2) is more than about 5 percent of an area of the substrate and falls within a range in which the opening (15) cannot adversely affect the mounting of the small transformer (3) and electronic components (5) on the mounting substrate (2), and a strength of the mounting substrate.

* * * * *

UNITED STATES PATENT AND TRADEMARK OFFICE
CERTIFICATE OF CORRECTION

PATENT NO. : 6,301,127 B1
DATED : October 9, 2001
INVENTOR(S) : Toshihiko Kobayashi It is certified that error appears in the above-identified patent and that said Letters Patent is hereby corrected as shown below:

<u>Title page,</u>
Item [75], Inventor replace "Iruma (JP)" with -- Saitama (JP) --.

<u>Column 3,</u>
Line 13, replace "<u>a</u>" with -- "a" --.

<u>Column 5,</u>
Line 29, replace "13 a" with -- 13a --.

<u>Column 6,</u>
Line 53, replace "<u>a</u>" with -- "a" --.

Signed and Sealed this

Twenty-fifth Day of June, 2002

Attest:

JAMES E. ROGAN
*Attesting Officer*  *Director of the United States Patent and Trademark Office*